(12) United States Patent
Remez et al.

(10) Patent No.: US 11,079,797 B1
(45) Date of Patent: Aug. 3, 2021

(54) ELECTRONIC DEVICES WITH ADJUSTABLE DISPLAY WINDOWS

(71) Applicant: Apple Inc., Cupertino, CA (US)

(72) Inventors: Roei Remez, Tel Aviv (IL); Shay Yosub, Kfar Yehezkel (IL); Hoon Sik Kim, San Jose, CA (US); Assaf Avraham, Giv'atayim (IL); Omer Eden, Cupertino, CA (US); Paul S. Drzaic, Morgan Hill, CA (US); Rafi Ambar, Ramat Gan (IL); Refael Della Pergola, Jerusalem (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/874,557

(22) Filed: May 14, 2020

(51) Int. Cl.
*G06F 1/16* (2006.01)
*H05K 5/00* (2006.01)
*G06F 3/041* (2006.01)
*H05K 5/02* (2006.01)

(52) U.S. Cl.
CPC .......... *G06F 1/1626* (2013.01); *G06F 1/1637* (2013.01); *G06F 3/0412* (2013.01); *H05K 5/0017* (2013.01); *H05K 5/0226* (2013.01)

(58) Field of Classification Search
CPC .... G06F 1/1626; G06F 3/0412; G06F 1/1637; H05K 5/0017; H05K 5/0226
See application file for complete search history.

(56) References Cited

U.S. PATENT DOCUMENTS

| | | | | |
|---|---|---|---|---|
| 8,842,215 | B2* | 9/2014 | Wittenberg | .......... H04N 5/2254 |
| | | | | 348/357 |
| 8,947,627 | B2* | 2/2015 | Rappoport | ............ G06F 1/1698 |
| | | | | 349/151 |
| 9,013,867 | B2 | 4/2015 | Becze et al. | |
| 9,460,689 | B2 | 10/2016 | Lee et al. | |
| 9,952,706 | B2 | 4/2018 | Cho et al. | |
| 10,331,260 | B2* | 6/2019 | Evans, V | ............ H04M 1/0264 |
| 10,389,927 | B2* | 8/2019 | Zhang | .................... G03B 29/00 |
| 10,728,371 | B2* | 7/2020 | Kwon | .................. G09G 3/3208 |
| 2003/0062490 | A1* | 4/2003 | Fujieda | .............. G06K 7/10881 |
| | | | | 250/556 |
| 2006/0181607 | A1* | 8/2006 | McNelley | .............. H04N 7/144 |
| | | | | 348/14.08 |
| 2011/0314742 | A1* | 12/2011 | Hsu | ......................... G03B 9/36 |
| | | | | 49/358 |

(Continued)

*Primary Examiner* — Abhishek M Rathod
(74) *Attorney, Agent, or Firm* — Treyz Law Group, P.C.; G. Victor Treyz; Kendall W. Abbasi

(57) ABSTRACT

An electronic device may have a display with an array of pixels for displaying images. The display may have a window region. During operation, a component such as an optical component may operate through the window region. The window region may overlap a movable portion of the display. The window region may be operated in open and closed states. In the closed state, the movable portion of the display overlaps the window region and pixels in the movable display portion emit light through the window region. In the open state, the movable portion of the display is moved away from the window region so that light for the optical component may pass through the window region. The optical component may be a camera or other component that receives light through the window region or may be an optical component that emits light through the window region.

22 Claims, 14 Drawing Sheets

(56) References Cited

U.S. PATENT DOCUMENTS

| | | | |
|---|---|---|---|
| 2013/0021427 A1* | 1/2013 | Park | G06F 1/1686 |
| | | | 348/14.02 |
| 2013/0063676 A1* | 3/2013 | Tsuchihashi | G02F 1/13338 |
| | | | 349/54 |
| 2014/0063049 A1* | 3/2014 | Armstrong-Muntner | |
| | | | G03B 9/00 |
| | | | 345/619 |
| 2014/0092283 A1* | 4/2014 | Yang | G02B 26/0841 |
| | | | 348/294 |
| 2014/0111953 A1 | 4/2014 | McClure et al. | |
| 2016/0098132 A1 | 4/2016 | Kim et al. | |
| 2017/0083047 A1* | 3/2017 | Helot | H01L 27/323 |
| 2017/0257566 A1* | 9/2017 | Evans, V | H04N 5/23216 |
| 2019/0305237 A1* | 10/2019 | Shin | H01L 51/0097 |
| 2020/0020493 A1* | 1/2020 | Weaver | H04N 5/2257 |
| 2020/0266845 A1* | 8/2020 | Kumar | G06F 1/1656 |
| 2020/0326754 A1* | 10/2020 | Kim | H04M 1/0264 |

\* cited by examiner

ELECTRONIC DEVICES WITH ADJUSTABLE DISPLAY WINDOWS

FIELD

This relates generally to electronic devices, and, more particularly, to electronic devices with displays.

BACKGROUND

Electronic devices often include displays. A touch screen display may be used in a cellular telephone or other portable device to display information for a user and to gather user input. Some electronic devices include optical components such as cameras.

SUMMARY

An electronic device may have a display with an array of pixels for displaying images. The display may have a window. During operation, a component such as an optical component may operate through a window region in a display. The window region may overlap a movable portion of the display.

A display window may be operated in open and closed states. In the closed state, the movable portion of the display overlaps the window region and pixels in the movable display portion emit light from the window region. In the open state, the movable portion of the display is moved away from the window region so that light for the optical component may pass through the window region. The optical component may be a camera or other component that receives light through the window region or may be an optical component that emits light through the window region.

The movable portion of the display may be an integral portion of a flexible display such as a flap of the flexible display that is bent away from remaining portions of the flexible display when opening the display window or may be a rigid display layer that moves about a hinge. Sliding display arrangements and other display arrangements that allow the movable portion of the display to selectively cover and uncover the window region may be used, if desired. An electrically adjustable actuator may move the movable display portion.

The display portion may have a coating that reflects light for the optical component when the window is open. The coating may be transparent to light emitted by pixels in the movable display portion when the window is closed. Configurations in which a mirror is aligned with the window or in which the optical component directly receives or emits light through the window without a mirror may also be used.

DETAILED DESCRIPTION

An electronic device may have input-output devices such as cameras and other optical components. The electronic device may also have a display. The display may have an array of pixels for displaying images for a user. The display may be an organic light-emitting diode display, a micro-light-emitting diode display formed from an array of crystalline semiconductor light-emitting diode dies, and/or may be any other suitable display. A two-dimensional touch sensor such as a capacitive touch sensor or other touch sensor may be incorporated into the display (e.g., by forming capacitive sensor electrodes from thin-film display circuitry) and/or a touch sensor layer may overlap the array of pixels in the display.

It may be desirable to hide cameras and other input-output devices from view when not in use. Accordingly, the electronic device may be provided with one or more adjustable windows. The windows may be formed in display window regions that overlap input-output devices in the electronic device. For example, a window may overlap a camera or other optical component.

In an illustrative configuration, the adjustable window may be formed in a portion of the display of the electronic device where the adjustable window is partly or completely surrounded by the pixels in the display. The window may be placed in an open state (sometimes referred to as a transparent state) when it is desired to allow an input-output device such as a camera to operate through the window. The window may be placed in a closed state (sometimes referred to as an opaque state) when it is desired to cover the camera or other input-output device and thereby hide the device from view. To avoid creating inactive holes or other inactive regions in the display as the display presents an image to the user, the window may be formed from a display portion that has active pixels. When the window is in the closed state, the active pixels of the display portion may be used to display a portion of the image for the user in the window region. In this way, an unbroken continuous image may be displayed over some or all of a display surface of an electronic device when the window is closed.

In general, any suitable electronic devices may be provided with adjustable windows and adjustable windows may be formed on any suitable portions of an electronic device (e.g., a display surface on an exterior surface such as a side surface, front surface, and/or rear surface). Arrangements in which adjustable windows are formed in displays such as displays on the front surface of an electronic device are described herein as an example.

Figure 1:
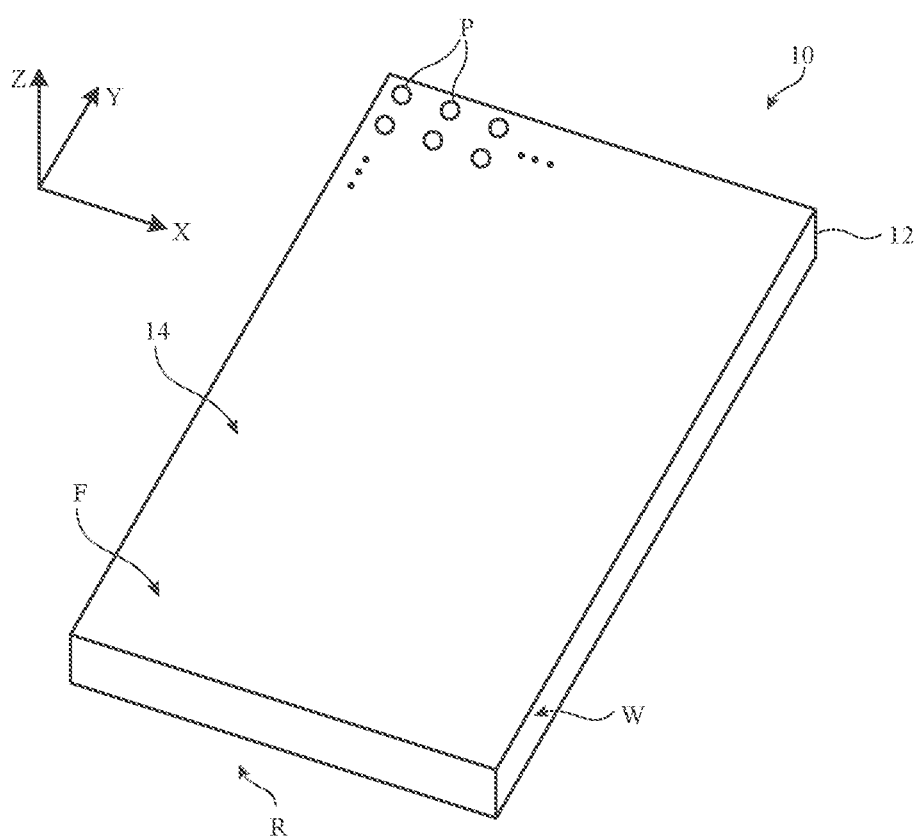
FIG. 1 is a perspective view of an illustrative electronic device in accordance with an embodiment.

A perspective view of an illustrative electronic device of the type that may include a display with an adjustable window is shown in FIG. 1. Device 10 may be a laptop computer, a computer monitor containing an embedded computer, a tablet computer, a desktop computer, a cellular telephone, a media player, or other handheld or portable electronic device, a smaller device such as a wristwatch device, a wristband device, a pendant device, a headphone or earpiece device, a head-mounted device such as glasses, goggles, a helmet, or other equipment worn on a user's head, or other wearable or miniature device, a television, a computer display that does not contain an embedded computer, a gaming device, a navigation device, an embedded system such as a system in which equipment is mounted in a kiosk, in an automobile, airplane, or other vehicle, a removable external case for electronic equipment, an accessory such as a remote control, computer mouse, track pad, wireless or wired keyboard, or other accessory, and/or equipment that implements the functionality of two or more of these devices. In the illustrative configuration of FIG. 1, device 10 is a portable electronic device such as a cellular telephone or tablet computer. This configuration may sometimes be described herein as an example.

As shown in FIG. 1, device 10 may have a housing such as housing 12. Housing 12 may be formed from materials such as polymer, glass, metal, crystalline materials such as sapphire, ceramic, fabric, foam, wood, other materials, and/or combinations of these materials. Device 10 may have any suitable shape. In the example of FIG. 1, device 10 has front face F with a rectangular outline, opposing rear face R, and sidewall portions (sidewalls) W. Portions W may be formed as extensions of the housing structures on front face F, rear face R, and/or may be formed using one or more separate sidewall members (as examples). Sidewall structures may be planar (e.g., to form vertical sidewalls extending between front F and rear R) and/or may have curved cross-sectional profiles. Input-output devices such as one or more buttons may be mounted on housing 12 (e.g., on sidewall portions W).

Device 10 may have one or more displays such as display 14. In the example of FIG. 1, display 14 covers front face F. Display 14 may also be mounted on other portions of device 10. For example, one or more displays such as display 14 may cover all of front face F, part of front face F, some or all of rear face R, and/or some or all of sidewalls W.

Housing 12 may include outwardly facing structures that form external device surfaces and/or may include frame structures, supporting plates, and/or other internal support structures. In some configurations, some or all of display 14 may be covered with flexible or rigid transparent members. Transparent members such as these may cover displays. Such transparent display cover layer structures, which may sometimes be referred to as housing structures, may overlap at least some of display 14 and may serve as a display cover layer. If desired, transparent thin-film structures may serve as protective display layers (e.g., scratch-resistance layers, oleophobic anti-smudge coating layers, etc.).

Display 14 may have a planar shape, a shape with a curved cross-sectional profile, or other suitable shape. In the example of FIG. 1, front face F has a planar shape and lies in the X-Y plane. Display 14 may have a rectangular footprint (outline when viewed from above) or other suitable footprint. Device 10 may be elongated along a longitudinal axis that extends parallel to the Y axis of FIG. 1 or along other directions (e.g., parallel to the X axis of FIG. 1). The thickness of device 10 in dimension Z may be less than the width of device 10 in dimension X and less than the length of device 10 in dimension Y (as an example).

Display 14 may have an array of pixels P. Pixels P form an active display area that displays images for a user during operation of device 10. If desired, an array of touch sensor electrodes (e.g., capacitive touch sensor electrodes) may overlap display 14 and pixels P (e.g., display 14 may be a touch screen display). Pixels P may be organic light-emitting diode pixels, pixels formed from crystalline semiconductor light-emitting diode dies, liquid crystal display pixels, electrophoretic display pixels, and/or pixels associated with other types of displays.

Figure 2:
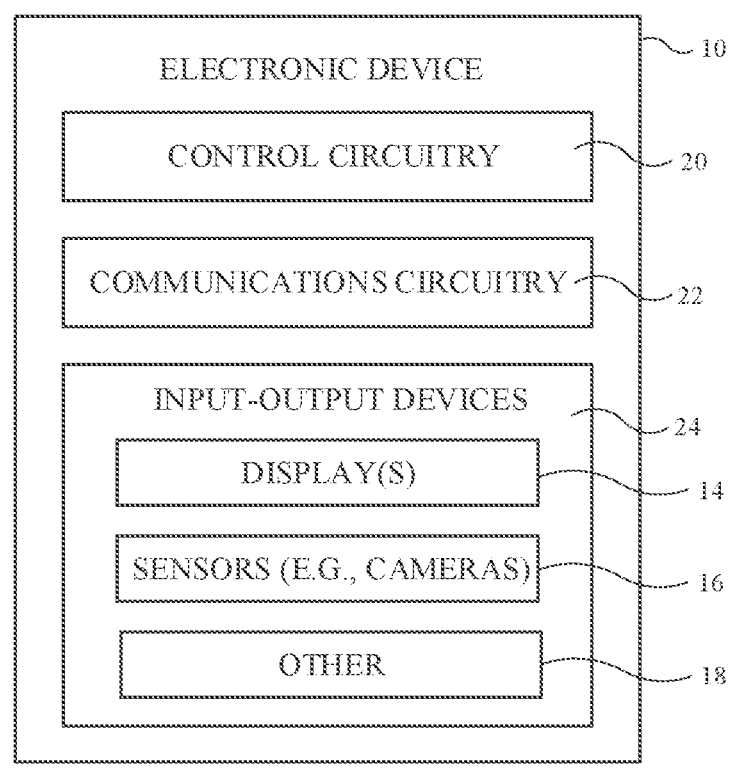
FIG. 2 is a schematic diagram of an illustrative electronic device in accordance with an embodiment.

A schematic diagram of an illustrative electronic device is shown in FIG. 2. Device 10 of FIG. 2 may be operated as a stand-alone device and/or the resources of device 10 may be used to communicate with external electronic equipment. As an example, communications circuitry in device 10 may be used to transmit user input information, sensor information, and/or other information to external electronic devices (e.g., wirelessly or via wired connections) and/or may be used to receive such information from external electronic devices. Each of these external devices may include components of the type shown by device 10 of FIG. 2.

As shown in FIG. 2, electronic device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid-state drive), volatile memory (e.g., static or dynamic random-access-memory), etc. Processing circuitry in control circuitry 20 may be used to gather input from sensors (e.g., cameras) and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use display(s) 14 and other output devices in providing a user with visual output and other output.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment (e.g., a companion device such as a computer, cellular telephone, or other electronic device, an accessory such as a point device, computer stylus, or other input device, speakers or other output devices, etc.) over a wireless link. For example, circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link. Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Electronic components such as input-output devices 24 may be used in gathering user input, in gathering information on the environment surrounding the user, and/or in providing a user with output. Devices 24 may include one or more displays such as display(s) 14. Display(s) 14 may include one or more display devices such as organic light-emitting diode display panels (panels with organic light-emitting diode pixels formed on polymer substrates or silicon substrates that contain pixel control circuitry), liquid crystal display panels, microelectromechanical systems displays (e.g., two-dimensional mirror arrays or scanning mirror display devices), display panels having pixel arrays formed from crystalline semiconductor light-emitting diode dies (sometimes referred to as microLEDs), and/or other display devices.

Sensors 16 in input-output devices 24 may include force sensors (e.g., strain gauges, capacitive force sensors, resistive force sensors, etc.), audio sensors such as microphones, touch and/or proximity sensors such as capacitive sensors such as a touch sensor that forms a button, trackpad, or other input device), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors (e.g., cameras such as cameras on front face F and/or rear face R of device 10), fingerprint sensors, iris scanning sensors, retinal scanning sensors, and other biometric sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors such as blood oxygen sensors, heart rate sensors, blood flow sensors, and/or other health sensors, radio-frequency sensors, three-dimensional camera systems such as depth sensors (e.g., structured light sensors and/or depth sensors based on stereo imaging devices that capture three-dimensional images) and/or optical sensors such as self-mixing sensors and light detection and ranging (lidar) sensors that gather time-of-flight measurements (e.g., time-of-flight cameras), humidity sensors, moisture sensors, gaze tracking sensors, electromyography sensors to sense muscle activation, facial sensors, interferometric sensors, time-of-flight sensors, magnetic sensors, resistive sensors, distance sensors, angle sensors, and/or other sensors. In some arrangements, device 10 may use sensors 16 and/or other input-output devices 24 to gather user input. For example, input-output devices 24 such as buttons may be used to gather button press input, touch sensors overlapping displays can be used for gathering user touch screen input, touch pads may be used in gathering touch input, microphones may be used for gathering audio input (e.g., voice commands), accelerometers may be used in monitoring when a finger contacts an input surface and may therefore be used to gather finger press input, etc.

Input-output devices 24 may include optical components such as camera(s), depth sensors (e.g., structured light sensors or other sensors that gather three-dimensional image data), optical proximity sensors, ambient light sensors (e.g., color ambient light sensors), optical time-of-flight sensors (cameras) and other sensors 16 that are sensitive to visible and/or infrared light and that may emit visible and/or infrared light (e.g., devices 24 may contain optical sensors that emit and/or detect light). For example, a visible-light image sensor in a camera may have a visible light flash or an associated infrared flood illuminator to provide illumination while the image sensor captures a two-dimensional and/or three-dimensional image. An infrared camera such as an infrared structured light camera that captures three-dimensional infrared images may have an infrared flood illuminator that emits infrared flood illumination and/or may have a dot projector the emits an array of infrared light beams. Infrared proximity sensors may emit infrared light and detect the infrared light after the infrared light has reflected from a target object.

If desired, electronic device 10 may include additional components (see, e.g., other devices 18 in input-output devices 24). The additional components may include haptic output devices, actuators for moving movable structures in device 10, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

It may be desirable to locate optical components and other input-output devices 24 on front face F of device 10 (e.g., so that sensors may measure ambient light and/or otherwise sense the environment, may measure proximity to a user's head, may capture two-dimensional and/or three-dimensional images of the user's face and/or may otherwise interact with the user). To help hide optical devices and other input-output devices 24 from view on front face F, one or more of these devices may be located under an adjustable window region in display 14. The structures used in forming the adjustable window of device 10 may have pixels P that form part of display 14 when display 14 is being used to present images to a user. In this way, the presence of the adjustable window may not be noticeable to a user.

Figure 3:
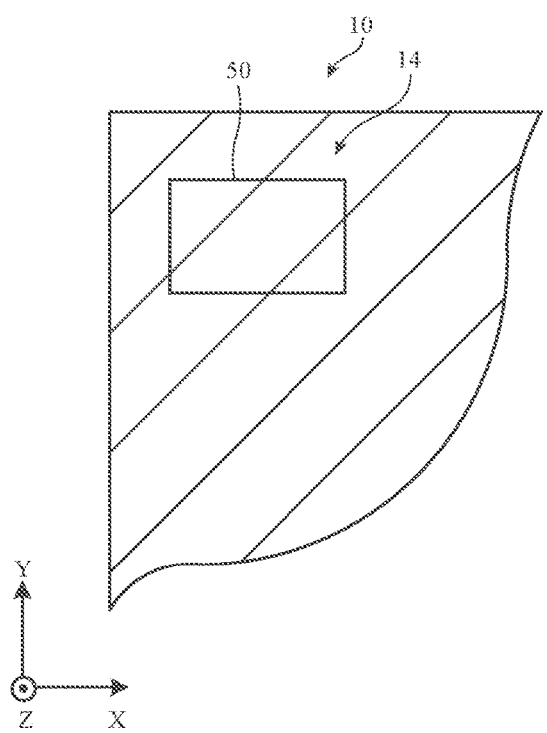
FIG. 3 is top view of an illustrative electronic device display with a closed display window in accordance with an embodiment.
Figure 4:
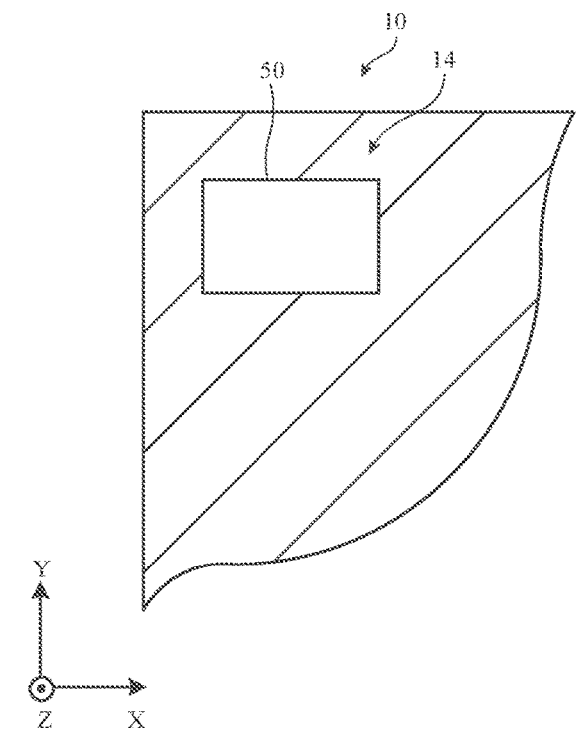
FIG. 4 is top view of the illustrative electronic device display of FIG. 3 in which the display window is open in accordance with an embodiment.

Consider, as an example, the arrangement of FIGS. 3 and 4, in which adjustable window (window region) 50 is formed in display 14. Window 50 may, for example, be configured to overlap with a camera or other input-output device 24.

In the configuration of FIG. 3, window 50 has been closed and has been adjusted to display a portion of the image that is being presented on display 14. In this state, window 50 is opaque and blocks internal structures in device 10 from view.

In the configuration of FIG. 4, window 50 has been placed in its open state. In this state, window 50 is transparent and/or is otherwise configured to allow the overlapped camera or other input-output device 24 in device 10 to emit and/or detect light through window 50 and/or to otherwise operate through window 50.

In general, window 50 may have any suitable shape. The outline of window 50 may, as an example, have a rectangular shape, a circular or oval shape, a shape with straight and/or curved edges, and/or other suitable footprint. There may be one or more discontinuous regions of display 14 that form window 50. Window 50 may be located along the upper edge of display 14 (e.g., at the upper left corner, upper center edge, or upper right corner of display 14) and/or at other portions of display 14. If desired, window 50 may form a notch along an edge of display 14. In other configurations, window 50 forms an island surrounded on all sides by active portions of display 14 (e.g., pixels P in portions of display 14 other than window 50 may surround window 50 and the pixels of window 50).

Window 50 may be adjusted mechanically and/or electrically (e.g., by turning on pixels P in window 50 when window 50 is closed and/or turning off pixels P when window 50 is open. Mechanical adjustments may involve display movement (e.g., folding, sliding, and/or rolling). For example, the portion of display 14 in window 50 may move due to display bending, display rolling (e.g., wrapping an end portion of display 14 and/or the pixels of window 50 around a roller), and/or display sliding (e.g., using one or more rollers or other structures to slide a portion of display 14 to open window 50).

Figure 5:
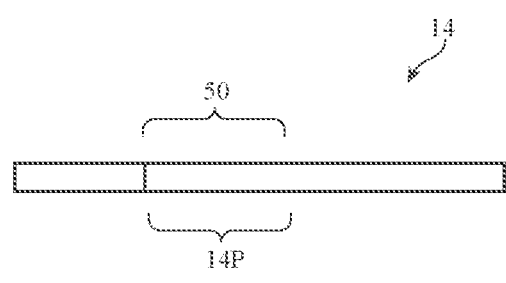
FIGS. 5 and 6 are cross-sectional side views of an illustrative electronic device with a window that opens by bending or otherwise rotating a portion of a display in accordance with an embodiment.
Figure 6:
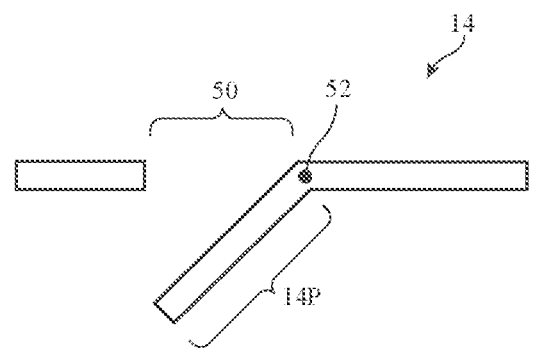

An illustrative display bending arrangement is shown in FIGS. 5 and 6. In the configuration of FIG. 5, display 14 is in its normal unbent state and window 50 is closed. Display 14 may be planar in this state or may have other suitable shapes. When it is desired to use an input-output device that is overlapped by the portion of display 14 in window 50, this portion of display 14 (e.g., portion 14P) may be bent to open window 50, as shown in FIG. 6. An actuator (e.g., a piezoelectric actuator, a motor, solenoid, or other electromagnetic actuator, a shape memory metal actuator, a pneumatic actuator, an electroactive polymer actuator, and/or other computer-controlled positioner) may be used to move a flap of display 14 such as portion 14B about bend axis 52 under control of signals from control circuitry 20. Display portion 14P may be an integral portion of a flexible display (e.g., display 14 may be an organic light-emitting diode display with a flexible substrate, a display with an array of pixels formed from respective crystalline semiconductor light-emitting diode dies mounted to a flexible substrate, etc.) and/or display portion 14P may be formed from a separate display structure (e.g., a rigid display structure that moves relative to the rest of display 14 using a hinge.

Figure 7:
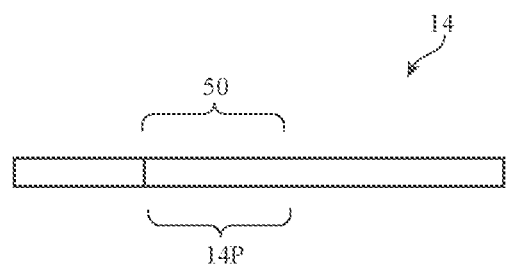
FIGS. 7 and 8 are cross-sectional side views of an illustrative electronic device with a window that opens by sliding a display in accordance with an embodiment.
Figure 8:
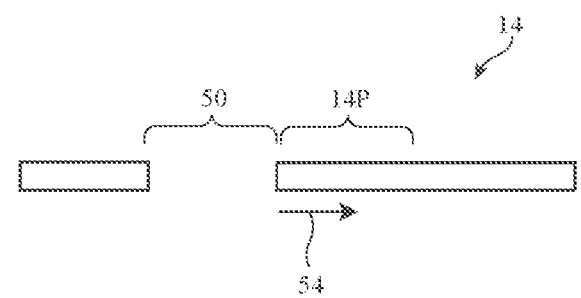

If desired, window 50 may be adjusted using a sliding display arrangement. This type of approach is illustrated in FIGS. 7 and 8. As shown in FIG. 7, display 14 and display portion 14P may initially be in a position in which portion 14P covers and closes adjustable window 50. In this position, pixels P in portion 14P and pixels P in the remaining portions of display 14 may be used to display an image. Internal device components such as one or more input-output device 24 that are associated with window 50 may be blocked from view. When it is desired to operate the camera or other input-output device(s) 24 that is associated with window 50, window 50 may be opened. As shown in FIG. 8, for example, display portion 14P (and, if desired, other portions of display 14 that are attached to portion 14P) may be moved (slid) in direction 54, thereby uncovering window 50 and an overlapped camera or other input-output device 24 that is aligned with window 50.

Figure 9:
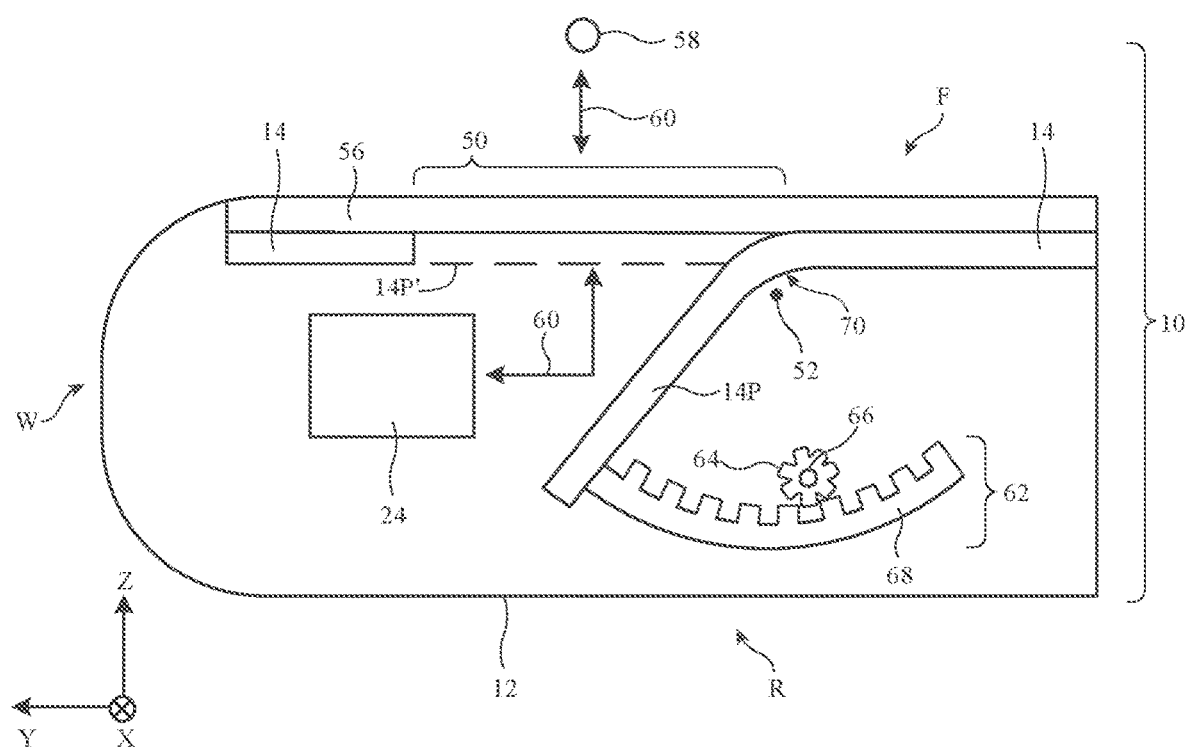
FIG. 9 is a cross-sectional side view of a portion of an illustrative electronic device having a window with a bendable display region in accordance with an embodiment.

A cross-sectional view of an end portion of an illustrative electronic device with a bending flexible display portion in window 50 is shown in FIG. 9. As shown in FIG. 9, display 14 may be formed on front face F of device 10. Display 14 may have an array of pixels for displaying an image. A transparent protective layer such as display cover layer 56 may cover front face F and display 14 (e.g., layer 56 may overlap window 50 and surrounding portions of display 14). During operation, a user may view the image presented on display 14 through display cover layer 56. Layer 56 may be formed from transparent materials such as glass, polymer, sapphire and/or other crystalline materials, optical fibers formed form one or more of these materials and/or other materials, and/or other clear materials. Layer 56, which may sometimes be referred to as a transparent housing structure or transparent housing wall, may extend across front face F and, if desired, over some or all of sidewall portions W and rear face R.

An actuator such as actuator 62 may open and close window 60 by moving display portion 14P to cover or uncover a window opening in display 14. Actuator 62 may, as an example, have a rotatable gear such as gear 64 that is rotated on a shaft about axis 66 by an electrically controlled motor. The teeth of gear 64 may engage corresponding teeth on toothed member 68, thereby allowing member 68 to move display portion 14P to an open position in which window 60 is uncovered by portion 14P (as show in FIG. 9) or to a closed position (see. e.g., position 14P') in which portion 14P covers window 50 and uses its pixels to display a portion of the image on display 14. Display 14 may be a flexible display and display portion 14P may be an integral portion of the flexible display that bends about axis 52 as actuator 62 opens window 50 or display portion 14P may be separated from remaining portions of display 14 at location 70 (e.g., portion 14P may be separate rigid panel that is rotated using a hinge, etc.). If desired, a separate flexible and/or rigid panel forming portion 14P may be moved into and out of place by sliding motion instead of rotation (as an example).

When window 50 is open, a camera or other input-output device 24 may operate through window 50. Window 50 may, as an example, have an overlapping clear portion of display cover layer 56 through which light may enter and/or exit device 10. Device 24 may emit light and/or gather light that travels along path 60 and that reflects from portion 14P while portion 14P is angled as shown in FIG. 9 (e.g., while portion 14P is oriented at a 45 angle or other appropriate angle with respect to display cover layer 56, which lies generally in the X-Y plane of FIG. 9). For example, in a scenario in which device 24 is a camera, device 24 can capture an image of external object 58 (e.g., image light from object 58 will reflect from portion 14P to device 24 after traveling through layer 56). In scenarios in which device 24 emits light, this light may reflect from portion 14P towards object 58.

Figure 10:
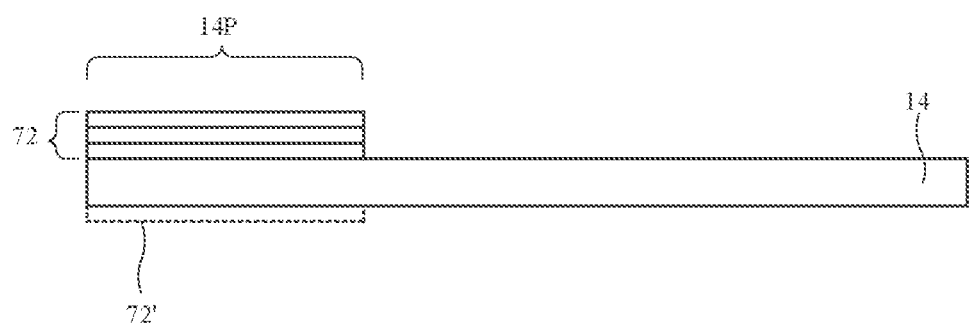
FIG. 10 is a cross-sectional side view of a portion of a bendable display with a reflective structure to reflect light in accordance with an embodiment.

To enhance the reflectivity of incoming and/or outgoing light from portion 14P when window 50 is open, portion 14P may be provided with one or more reflective structures such as illustrative reflective layer 72 of FIG. 10. Reflective layer 72 may, as an example, be a coating such as a thin-film interference filter mirror that has a stack of dielectric layers (e.g., inorganic and/or organic layers of different refractive indices such as dielectric layers with alternating higher and lower refractive indices). If desired, reflectivity may be enhanced using reflective thin-film layer(s) in display 14 (e.g., metal thin films and/or other reflective thin films) and/or using a thin-film interference filter mirror coating, metal reflective coating, and/or other reflective coating on the underside of display 14 (e.g., a reflective structure in position 72').

To ensure that device 24 transmits and/or receives light satisfactorily, display portion 14P (e.g., reflective layer 72 or other reflective structures in portion 14P) may be configured to reflect light along path 60 when display portion 14P is oriented at a non-zero angle (e.g., 45°) with respect to path 60 (e.g., with respect to device 24 and layer 56 of window 50). To ensure that display portion 14P is able to emit pixel light through window 50 when window 50 is in its closed state (e.g., when portion 14P is coplanar with layer 56 of FIG. 9 and lies in the X-Y plane), display portion 14P (e.g., reflective layer 72 or other reflective structures in portion 14P) may be configured to transmit image light vertically out of display portion 14P, through any reflective layer or other coating on display portion 14P, and through layer 56 of window 50 when display portion 14P lies in the X-Y plane.

Figure 11:
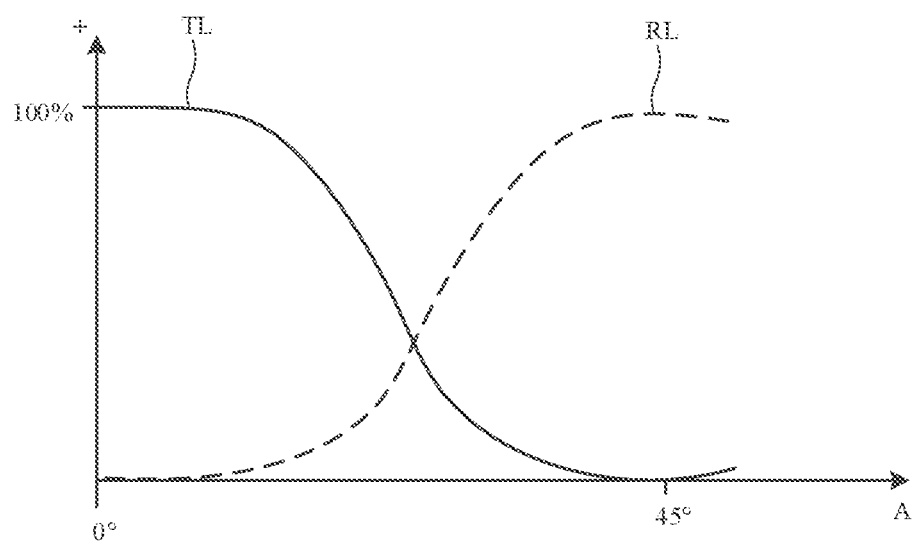
FIG. 11 is a graph showing how the reflectivity of a coating on a bendable display portion may vary as a function of incident angle in accordance with an embodiment.

Reflective layer 72 (e.g., a coating on an outer surface of the pixels of portion 14P, a reflective structure formed from embedded thin-film layers in the pixels of portion 14P, and/or a reflective structure a coating underneath the pixels of portion 14P) may be configured to exhibit these two desired attributes (high reflectivity for light associated with operation of device 24 when window 50 is open and portion 14P is bent by 45° and high transmission for emitted display light when window 50 is closed and portion 14P is at 0°). This is illustrated by the illustrative curves of FIG. 11 for transmittance TL and reflectance RL for display portion 14P (e.g., layer 72) as a function of incident light angle A. A thin-film interference filter mirror or other layer 72 associated with display 14P may, as this example demonstrates, exhibit high light transmittance TL (e.g., at least 90% or at least 95%) for image light being emitted parallel to the surface normal of display portion 14P (e.g., at angle A=0°) when display portion 14P is in the X-Y plane (window 50 is closed) and may exhibit high light reflectance RL for light for device 24 traveling along path 60, which strikes display portion 14P at an angle A=45° when display portion 14P is bent by 45°.

Figure 12:
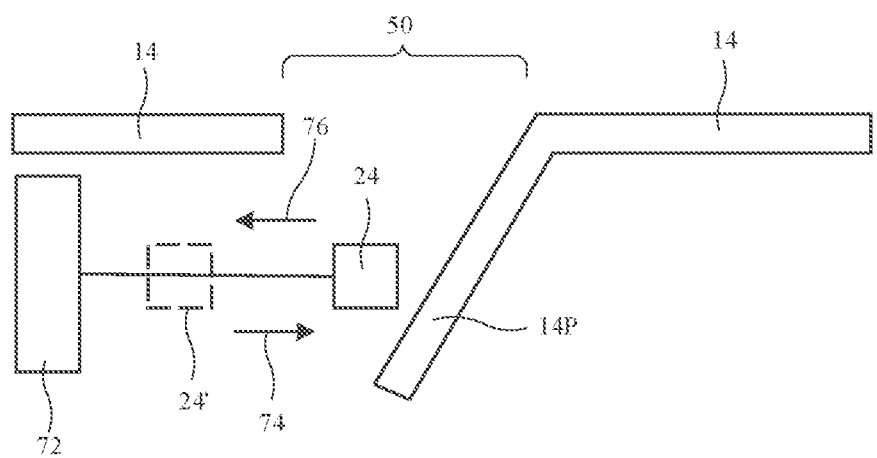
FIG. 12 is a cross-sectional side view of an illustrative device with a bendable display and a movable component that operates through a window created by bending the display in accordance with an embodiment.

Another illustrative approach for using window 50 is shown in FIG. 12. In this configuration, when portion 14P is bent downward to open window 50, actuator 72 is used to move device 24 in direction 74 from stowed position 24' to a position in alignment with window 50. When it is desired to close window 50, device 24 may be retracted to position 24' in direction 76 by actuator 72 and portion 14P may be moved upwards to cover window 50.

Figure 13:
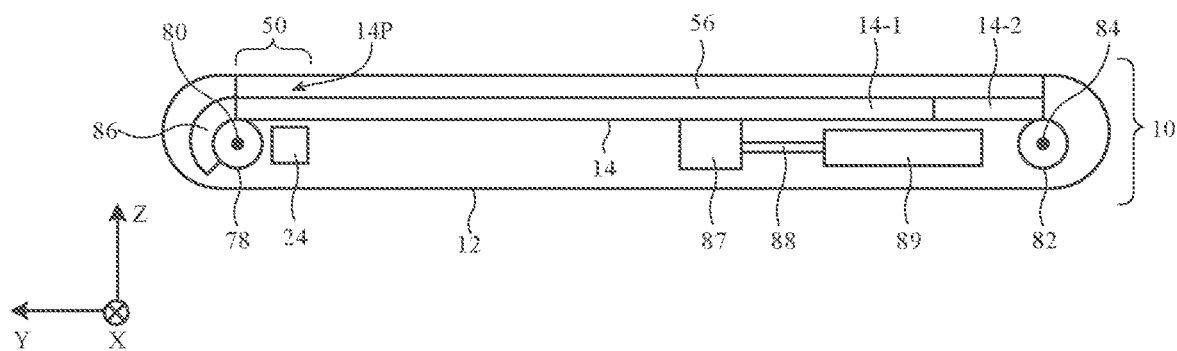
FIG. 13 is a cross-sectional side view of an illustrative electronic device with a slidable display arranged to cover a display window in accordance with an embodiment.
Figure 14:
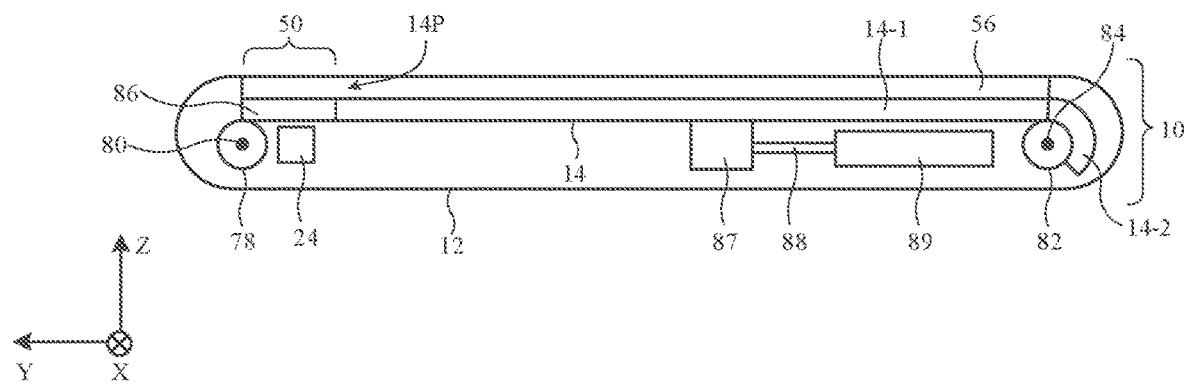
FIG. 14 is a cross-sectional side view of the illustrative electronic device of FIG. 13 in which the slidable display has been moved to uncover a window region associated with the display window in accordance with an embodiment.

In the illustrative configuration of FIGS. 13 and 14, display 14 is moved to open and close window 50. As shown in FIG. 13, display 14 is translated (e.g., along the Y axis) when it is desired to open and close window 50. Opposing ends of display 14 may be supported on rollers 78 and 82. Display 14 may be moved (e.g., slid laterally under the surface of layer 56) using actuators (e.g., motors) that rotate rollers 78 and/or 82 and/or may be moved using other actuators such as illustrative linear actuator 89 (e.g., an electromagnetic actuator) which is coupled to display 14 using attachment member 87 and a moving member associated with actuator 89 such as reciprocating member 88.

Display 14 may be a flexible display formed from light-emitting didoes on a flexible substrate (as an example). Flexible transparent portion 86 may be formed from an integral portion of the flexible display substrate or may be attached along an edge of display 14. In the configuration of FIG. 13, transparent portion 86 has been wrapped around roller 78 for storage. In this position, display portion 14P covers window 50 and window 50 is in its closed state. When it is desired to open window 50, roller actuators and/or linear actuators or other actuators such as actuator 89 move display 14 to the right. Roller 82 therefore rotates clockwise about axis 84 and roller 78 rotates clockwise about axis 80. This wraps the right-hand edge of display 14 about roller 82, moves display portion 14P away from window 50, and unwraps transparent portion 86 so that transparent portion 86 slides into place in to overlap the window region associated with window 50, as shown in FIG. 14. The content being displayed on display 14 can be adjusted accordingly (e.g., to account for the right-hand portion of display 14 which may no longer be visible to the user). Because portion 86 is transparent and overlaps device 24 and window 50, device 24 can operate through window 50.

If desired, display 14 may have one or more rigid portions. For example, portion 14-1 of display 14 of FIGS. 13 and 14 may be rigid. In this type of arrangement, edge portion 14-2 of display 14 may be flexible to accommodate rolling of this portion of display 14 around roller 82.

If desired, control circuitry 20 can adjust display 14 dynamically so that the image being displayed on display 14 slides to the left across the pixels on the front of display 14 at the same speed that the edge of display 14 is being wrapped downward to the right onto roller 84. In this way, the image being displayed by display 14 will remain at a fixed position relative to housing 12. Even though display 14 is being moved (slid to the right in the illustrative configurations of FIGS. 13 and 14) to open window 50, the user of device 10 may view content on display 14 at a static location. As this example demonstrates, the speed of sliding movement of the displayed image across the pixels of display 14 may be synchronized with the physical sliding speed of the display in the opposite direction to compensate for the physical sliding movement of display 14. Use of this type of arrangement in device 10 of FIGS. 13 and 14 and/or other devices 10 with sliding displays therefore helps allow a user to read text or view other content in an image on display 14, without being unnecessarily disturbed by undue movement of the displayed content.

Figure 15:
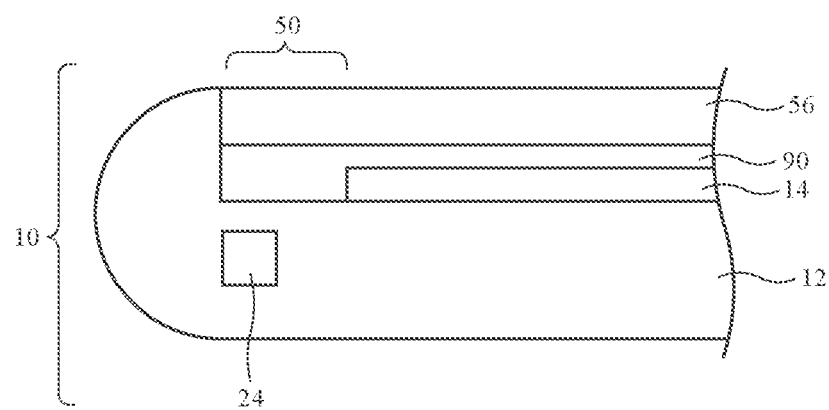
FIG. 15 is a cross-sectional side view of an illustrative electronic device with a sliding display and an air gap in accordance with an embodiment.
Figure 16:
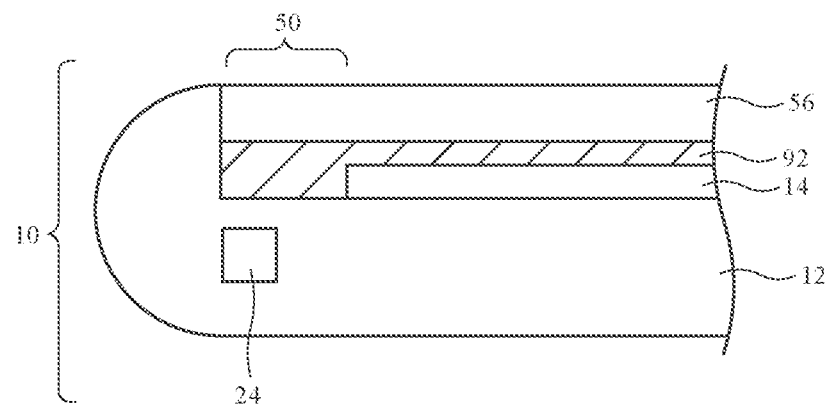
FIG. 16 is a cross-sectional side view of an illustrative electronic device with a sliding display and an index matching fluid in accordance with an embodiment.

As shown in FIG. 15, an air gap such as air gap 90 may be formed between display 14 and layer 56. In this type of arrangement, there may be an air gap between device 24 and the underside of layer 56 in window 50. The presence of air gap 90 may help reduce Newton's rings and/or other undesired optical artifacts due to contact between the surface of display 14 and the opposing inner surface of layer 56. If desired, an index-matching fluid such as oil or other fluid (e.g., liquid with a refractive index value within 15%, within 5%, or within other suitable amount of the refractive index value of the surface structures of display 14 and/or layer 56) may be incorporated into the space between the outwardly facing surface of display 14 and the opposing inwardly facing surface of layer 56 (see, e.g., index-matching fluid 92 of FIG. 16). The presence of fluid 92 between display 14 and layer 56 (and between device 24 and layer 50) may help reduce undesired Newton's rings and reflections.

Figure 17:
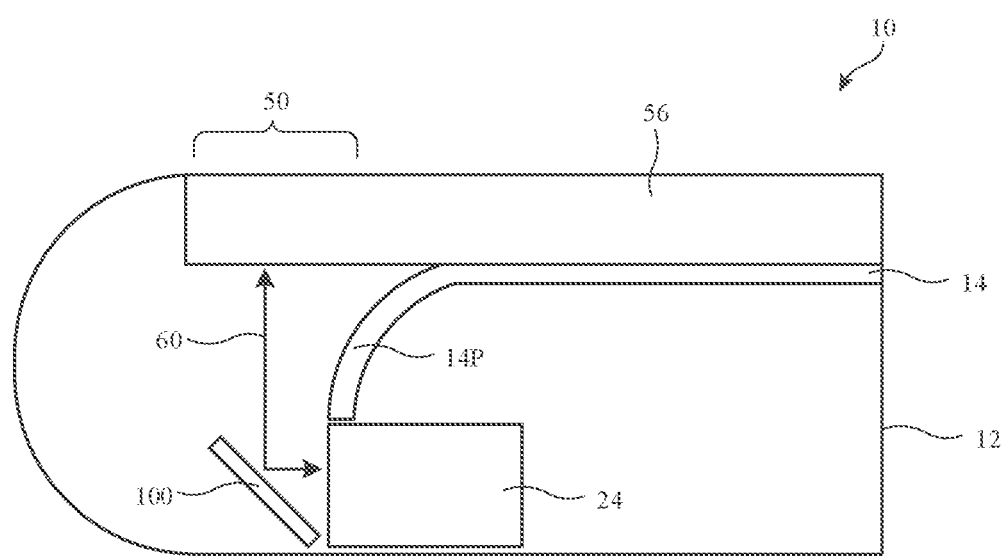
FIG. 17 is a cross-sectional side view of an illustrative electronic device with a display that folds to open a window that overlaps a mirror in accordance with an embodiment.

FIG. 17 is a cross-sectional side view of device 10 in an illustrative configuration in which device 10 includes a separate mirror such as mirror 100 rather than using a reflective coating on display portion 14P. Portion 14P may be folded in and out of place against layer 56 to close and open window 50 as shown in FIG. 17, display 14 may be moved laterally to cover and uncover window 50, or may otherwise be moved to open and close window 50. Device 24 may be a camera or other optical component that receives and/or emits light along path 60 through window 50 (e.g., a light path that involves a reflection from mirror 100).

Figure 18:
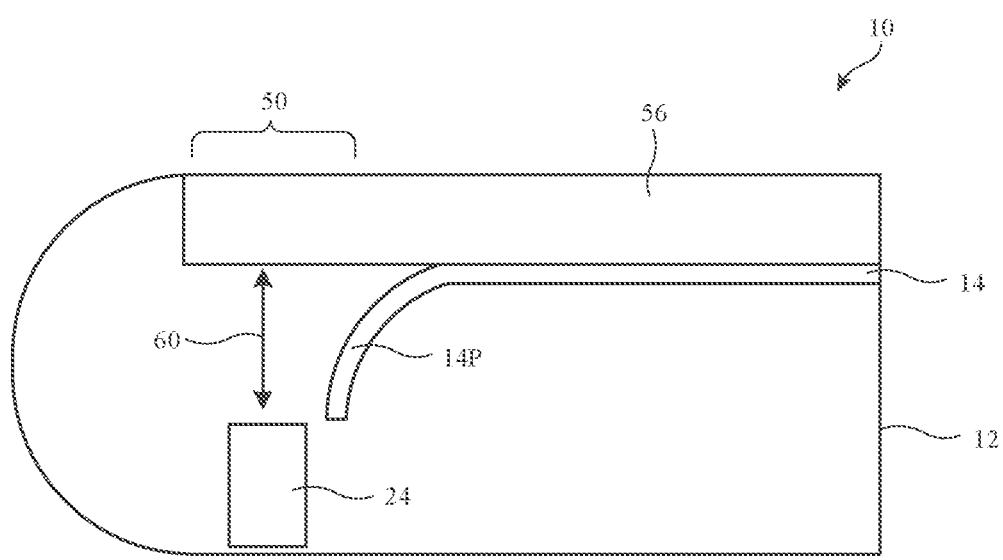
FIG. 18 is a cross-sectional side view of an illustrative electronic device with a display that folds to open a window that overlaps an electrical component in accordance with an embodiment.

In the example of FIG. 18, device 24 is located in alignment with window 50. In this arrangement, device 24 may operate through window 50 directly (e.g., to emit and/or receive light traveling along path 60 through layer 56 in window 50 without reflecting any light in path 60 from a mirror). Portion 14P may be folded using an actuator to open and close window 50 and/or window 50 may be opened and closed by sliding or otherwise moving display 14 using rollers or other structures.

Figure 19A:
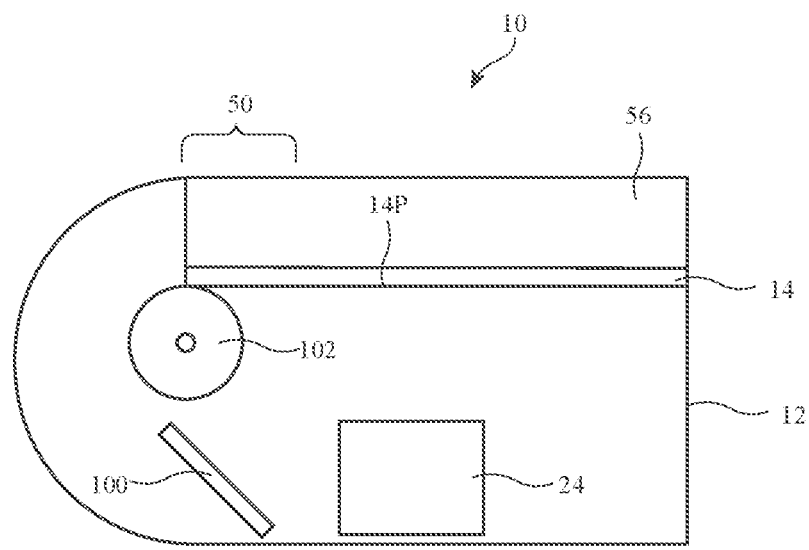
FIGS. 19A and 19B are cross-sectional side views of an illustrative electronic device with a window that is adjusted using a rolling display in accordance with an embodiment.
Figure 19B:
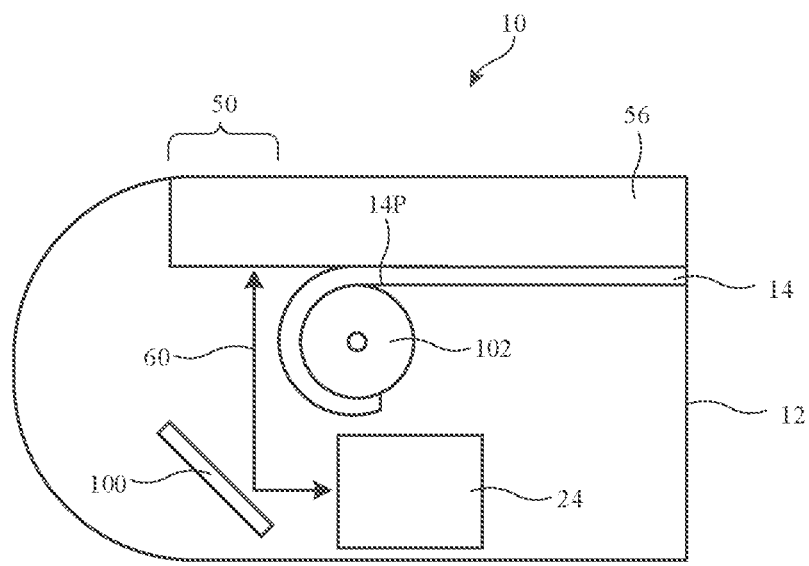

FIGS. 19A and 19B show how portion 14P of display 14 may be moved in and out of position using roller 102. Roller 102 may be rotated using an actuator (e.g., a rotating motor) and/or roller 102 may be moved using a linear actuator. Roller 102 may be rotated about a shaft that slides laterally within a groove or may otherwise be configured to support lateral movement during window opening and closing operations. In the configuration of FIG. 19A, roller 102 has been positioned to place display portion 14P over window 50, thereby closing window 50. In the configuration of FIG. 19B, roller 102 has been rotated counterclockwise and moved to the right. This causes display portion 14P to wrap around roller 102 and uncovers window 50. Mirror 100 may be overlapped by window 50. The alignment between window 50 and mirror 100 may allow light for device 24 to be emitted from device 24 and/or received by device 24 along path 60, which passes through the portion of layer 56 in window 50. Other arrangements in which window 50 is opened by rolling display portion 14P about a roller (e.g., arrangements in which device 24 is aligned directly with window 50 or in which light on path 60 reflects from portion 14P) may be used, if desired.

Figure 20:
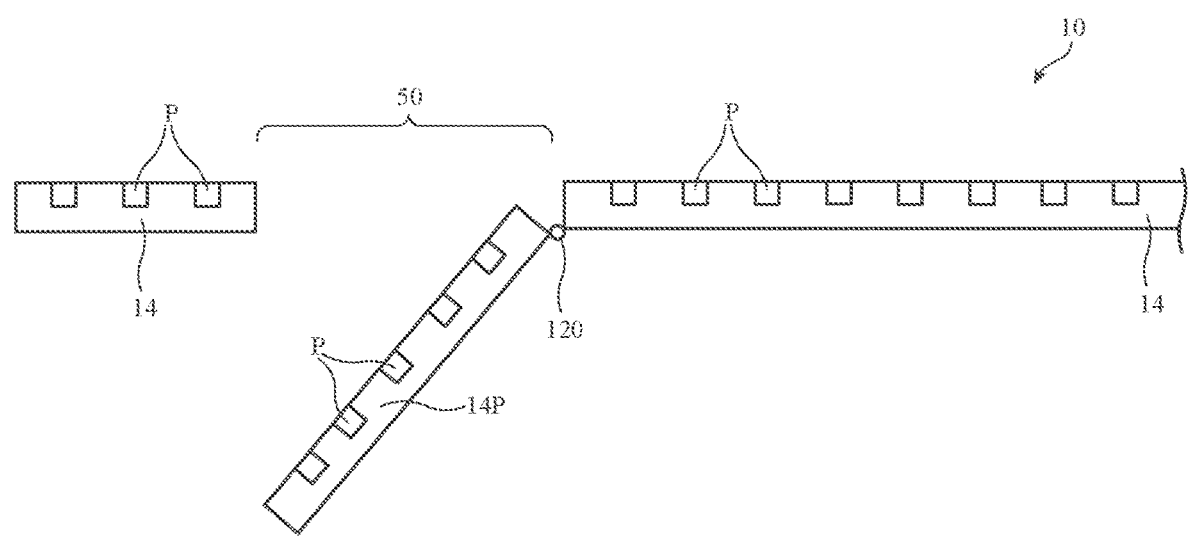
FIG. 20 is a cross-sectional side view of a display having a window region overlapped by a movable display portion with a rigid display substrate in accordance with an embodiment.

In the example of FIG. 20, an adjustable display window has been formed from a hinged rigid display layer. As shown in FIG. 20, display portion 14P and other (e.g., surrounding) portions of display 14 have pixels P. Pixels P may bet formed on a rigid substrate (e.g., a rigid display substrate formed from rigid printed circuit board material such as fiberglass-filled epoxy, a rigid display substrate formed from other polymer materials, a rigid display substrate formed from glass, a rigid display substrate formed from semiconductor, etc.). Pixels P may be light-emitting diodes formed from crystalline semiconductor dies or may be other pixels (e.g., organic light-emitting diode pixels, etc.). Portion 14P may have an edge that is attached to hinge 120. Hinge 120 may be formed from a layer of flexible material, a rigid structure with an opening that receives a shaft, and/or other hinge structures. Component 24 and/or a mirror from which light for component 24 reflects may be aligned with window 50. Portion 14P may be moved by an actuator between 1) a planar configuration in which portion 14P lies in the same plane as remaining portions of display 14 and closes window 50 and 2) a non-planar configuration of the type shown in FIG. 20 in which portion 14P is rotates out of the plane of the remaining portions of display 14 and opens window 50. Sliding configurations may also be used to open and close windows 50 formed using display portions 14P that are rigid, if desired. The hinged window arrangement of FIG. 20 is illustrative.

If desired, a reflective structure (e.g. a thin-film dielectric mirror, etc.) may be formed on portion 14P of FIG. 20 and device 24 may be an optical component that emits and/or receives light reflected from the reflective structure. Arrangements in which a folding display portion formed from a flexible display portion attached to remaining portions of display 14 operates through window 50, in which a display portion formed from a rigid and/or flexible display substrate that is attached to remaining portions of display 14 with a hinge such as hinge 120 of FIG. 20 operates through window 50, and/or arrangements in which a non-optical device operates through window 50 (e.g., a radio-frequency device, a speaker, microphone, or other audio device that operates through openings in layer 56 in window 50, and/or other non-optical device) may also be used.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is illustrative and various modifications can be made to the described embodiments. The foregoing embodiments may be implemented individually or in any combination.

What is claimed is:

1. An electronic device, comprising:
   a housing;
   a display cover layer;
   a component;
   an actuator; and
   a display configured to display an image, wherein
   the display is mounted under the display cover layer and wherein the display has a window that is operable in a closed state in which a portion of the display is in the window and displays a portion of the image and an open state in which the actuator moves the portion of the display away from the window and the component operates through the window.

2. The electronic device defined in claim 1 wherein the component comprises an optical component.

3. The electronic device defined in claim 2 wherein the optical component is configured to receive light that passes through a portion of the display cover layer overlapping the window.

4. The electronic device defined in claim 3 wherein the optical component comprises a camera.

5. The electronic device defined in claim 4 wherein the display comprises a flexible display and wherein the portion of the display is an integral portion of the flexible display that is configured to bend away from the window in the open state.

6. The electronic device defined in claim 4 wherein the portion of the display has a rigid substrate, the electronic device further comprising a hinge coupled to the rigid substrate.

7. The electronic device defined in claim 4 wherein the portion of the display is configured to slide between a first position in the closed state and a second position in the open state.

8. The electronic device defined in claim 7 further comprising at least one roller configured to receive the display as the display slides.

9. The electronic device defined in claim 7 wherein the display has pixels, wherein the display is configured to slide in a first direction at a speed, and wherein the display is configured to move the image across the pixels at the speed in a second direction that is opposite to the first direction to synchronize sliding movement of the displayed image with physical sliding movement of the display.

10. The electronic device defined in claim 4 wherein the portion of the display is moved away from the window by rolling the portion of the display about a roller.

11. The electronic device defined in claim 1 further comprising a reflective structure on the portion of the display.

12. The electronic device defined in claim 11 wherein the reflective structure comprises a thin-film dielectric stack configured to reflect light received through the window to the component in the open state and wherein the component comprises a camera.

13. The electronic device defined in claim 1 wherein the display has a rigid portion and a flexible portion and wherein the flexible portion wraps around a roller when the portion of the display is moved away from the window.

14. An electronic device, comprising:
    a housing having a transparent layer;
    a display overlapped by the transparent layer; and an optical component configured to receive light through a window region in the display, wherein the display has at least one movable portion that moves between a first position in which the movable portion covers the window region and a second position in which the movable portion does not cover the window region and the light passes through the window region to the optical component.

15. The electronic device defined in claim 14 further comprising a mirror aligned with the window region, wherein the mirror is configured to reflect the light that has passed through the window region.

16. The electronic device defined in claim 14 further comprising a coating on the movable portion, wherein the coating is configured to reflect the light that has passed through the window region to the optical component and is configured to pass light that is emitted from pixels in the movable portion.

17. The electronic device defined in claim 14 further comprising an actuator configured to move the optical component from a first position when the window region is covered to a second position when the window region is not covered.

18. The electronic device defined in claim 14 wherein the optical component is aligned with the window and is configured to directly receive the light that passes through the window region.

19. The electronic device defined in claim 14 wherein the optical component is configured to emit light that passes through the window region when the movable portion is in the second position.

20. The electronic device defined in claim 14 wherein the display comprises a flexible display and wherein the movable portion comprises a bendable flap of the flexible display.

21. An electronic device, comprising:
- a display having an array of pixels and having a window region surrounded by pixels in the array of pixels;
- an actuator; and
- an optical component configured to operate through the window region, wherein the display has a display portion that is configured to be moved by the actuator between a first position in which pixels in the display portion emit light in the window region and a second position in which the pixels in the display portion do not emit light in the window region.

22. The electronic device defined in claim 21 wherein the optical component comprises a camera configured to receive light that passes through the window region while the display portion is in the second position.

* * * * *